(12) United States Patent
Donohoe

(10) Patent No.: US 6,719,873 B1
(45) Date of Patent: *Apr. 13, 2004

(54) METHOD AND APPARATUS FOR PREVENTING PLASMA FORMATION

(75) Inventor: Kevin G. Donohoe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/670,360

(22) Filed: Sep. 26, 2000

Related U.S. Application Data

(63) Continuation of application No. 08/935,441, filed on Sep. 23, 1997, now Pat. No. 6,123,802.

(51) Int. Cl.[7] .................................................. C23F 1/02
(52) U.S. Cl. ........................................... 156/345; 216/2
(58) Field of Search ............................... 156/345; 216/2

(56) References Cited

U.S. PATENT DOCUMENTS

| | | | | |
|---|---|---|---|---|
| 5,449,410 A | * | 9/1995 | Chang et al. | 118/723 ER |
| 5,641,375 A | * | 6/1997 | Nitescu et al. | 156/345.1 |
| 5,851,343 A | * | 12/1998 | Hsu et al. | 156/345.25 |
| 6,123,802 A | * | 9/2000 | Donohoe | 156/345.48 |

* cited by examiner

Primary Examiner—Bernard Lipman
(74) Attorney, Agent, or Firm—Dorsey & Whitney LLP

(57) ABSTRACT

A plasma etching device is described in which gas is introduced into a reaction chamber through holes in a gas distribution plate. An electrode ignites the source gas into a plasma by capacitive coupling, and sustains the plasma by inductive coupling. A localized shield structure is provided which suppresses the electric field in locations in or near the holes of the gas distribution plate. Thus, plasma ignition in or near these holes is prevented, and hole lightup effects are avoided. By virtue of eliminating hole lightup, improved flexibility in gas distribution plate design and alignment is provided.

38 Claims, 3 Drawing Sheets

METHOD AND APPARATUS FOR PREVENTING PLASMA FORMATION

CROSS-REFERENCE TO RELATED APPLICATION

This application is a Continuation of U.S. patent application Ser. No. 08/935,441, filed Sep. 23, 1997, which issued as U.S. Pat. No. 6,123,802.

TECHNICAL FIELD

This invention relates generally to plasma etching during integrated circuit fabrication, and more particularly to methods and apparatus for preventing undesirable plasma formation during such fabrication.

BACKGROUND OF THE INVENTION

Integrated circuits are commonly fabricated on and within a surface region of a semiconductor substrate, such as a wafer of silicon. During such fabrication, various layers are produced within the substrate or deposited thereon. Some of these layers are then sized and dimensioned to form desired geometric patterns by means of various etching techniques. Such etching techniques include "wet" etching techniques, which typically use one or more chemical reagents brought into direct contact with the substrate, or "dry" etching techniques, such as plasma etching.

Numerous plasma-based etching techniques are known in the art, including what is commonly called the plasma etching mode, as well as reactive ion etching and reactive ion beam etching. In any of the wide variety of plasma etching techniques, a plasma is created by introducing a gas into a chamber in which one or more electrodes (commonly driven by an RF generator) generate the plasma by disassociation of the gas molecules into various ions, free radicals and electrons. The plasma then reacts with the material being etched from the semiconductor substrate.

FIG. 1 depicts a prior art plasma etching device 10, such as the Lam 9100, manufactured by Lain Research, Inc. The plasma etching device 10 includes an electrode such as a planar coil electrode 12, which is positioned proximate to a plate or window 14 formed from a suitable dielectric material. The window 14 is spaced apart from a dielectric gas distribution plate 16, with the space sealed by an O-ring 18. Source gases from which the plasma is to be generated are inserted into the gap formed between the window 14 and gas distribution plate 16. The source gases then diffuse through a plurality of openings or holes 20 included in the gas distribution plate 16 into a reaction chamber 22—the wall of which is typically grounded.

A high-voltage RF signal is applied to the planar coil electrode 12 and ignites a plasma within the reaction chamber 22. Ignition of the plasma occurs primarily by capacitive coupling of the electrode 12 with the source gas, due to the large magnitude voltages applied to the electrode. Once ignited, the plasma is sustained by electromagnetic induction effects associated with a time-varying magnetic field caused by the RF signal applied to the electrode 12.

A semiconductor wafer 24 is positioned within the reaction chamber 22 and is supported by a wafer platform or chuck 26. The chuck 26 is typically electrically biased to provide ion energies impacting the wafer 24 which are approximately independent of the RF voltage applied to the electrode 12. Volatile reaction products, as well as plasma species which did not interact with the wafer 24, are then pumped out of the reaction chamber 22, usually by means of a vacuum pump.

One disadvantage of devices such as the plasma etching device 10 of FIG. 1 is the existence of "hole lightup" effects. The capacitive coupling of the electrode 12 with the gases and/or plasma in the reaction chamber 22 can create electric fields of sufficient strength to ignite plasmas in or near the holes 20 of the gas distribution plate 16. This causes a number of problems. For example, when etching dielectric layers on the semiconductor wafer 24, source gases such as fluorocarbons are used, and the hole lightup effects cause polymer deposition in or near the holes 20 and on the window 14. In the case of particle deposition in or near the holes 20, the distribution of source gases into the reaction chamber 22 can be changed, resulting in (among other things) a potential lack of uniformity in the etching process occurring within the chamber. Those polymers or other materials deposited on the window 14 may ultimately flake off, resulting in particle contamination within the reaction chamber 22. Additionally, energy that was intended to ignite plasma within the reaction chamber 22 is instead wasted in the plasma ignition associated with hole lightup.

To avoid hole lightup effects, the current approach includes careful positioning, configuring, and sizing of the holes 20 included in the gas distribution plate 16. The holes 20 not positioned directly below portions of the planar coil electrode 12 suffer from lesser hole lightup effects than those holes positioned approximately below the electrode. As such, careful alignment and positioning of the holes 20 relative to the electrode 12 is required. Even so, some hole lightup effects still occur, resulting in deposition of particles and wear on portions of the holes 20. The gas distribution plate is not, however, readily moved or rotated to distribute these effects, because such movement is difficult to implement within the alignment constraints. Therefore, hole lightup effects and the constraints caused by minimizing such effects result in lower useful lifetimes for plasma etching device components such as the gas distribution plate 16. Furthermore, the location and configuration of the holes 20 cannot be designed for optimal process performance, due to the design constraints imposed by hole lightup effects.

SUMMARY OF THE INVENTION

In accordance with an embodiment of the present invention a plasma etching device for etching selected materials during integrated circuit fabrication is provided. The plasma etching device includes a reaction chamber adapted to receive the selected materials. The plasma etching device also includes gas flow structure adjoining the reaction chamber and including an opening through which gas can flow into the reaction chamber. An electrode is operable to produce an electromagnetic field for application to the gas within the reaction chamber to ignite a plasma therewithin. A shield structure is provided which is operable and positioned to suppress the electromagnetic field in a location proximate to and within the opening to prevent plasma formation therewithin.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures associated with plasma etching devices have not been shown in detail in order to avoid unnecessarily obscuring the description of the embodiments of the invention.

Figure 1:
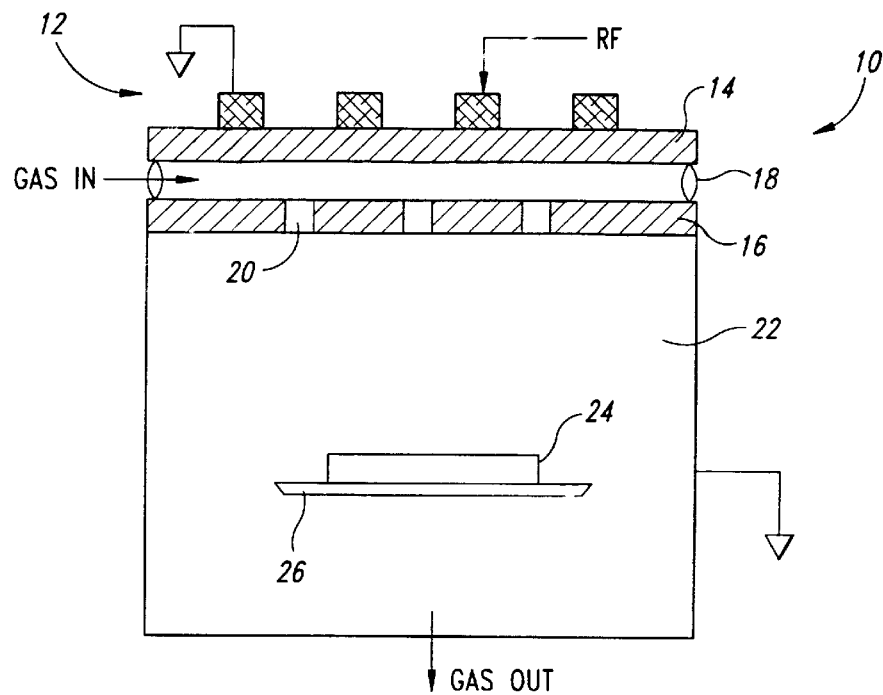
FIG. 1 is a partial cross-sectional view of a plasma etching device in accordance with the prior art.
Figure 2:
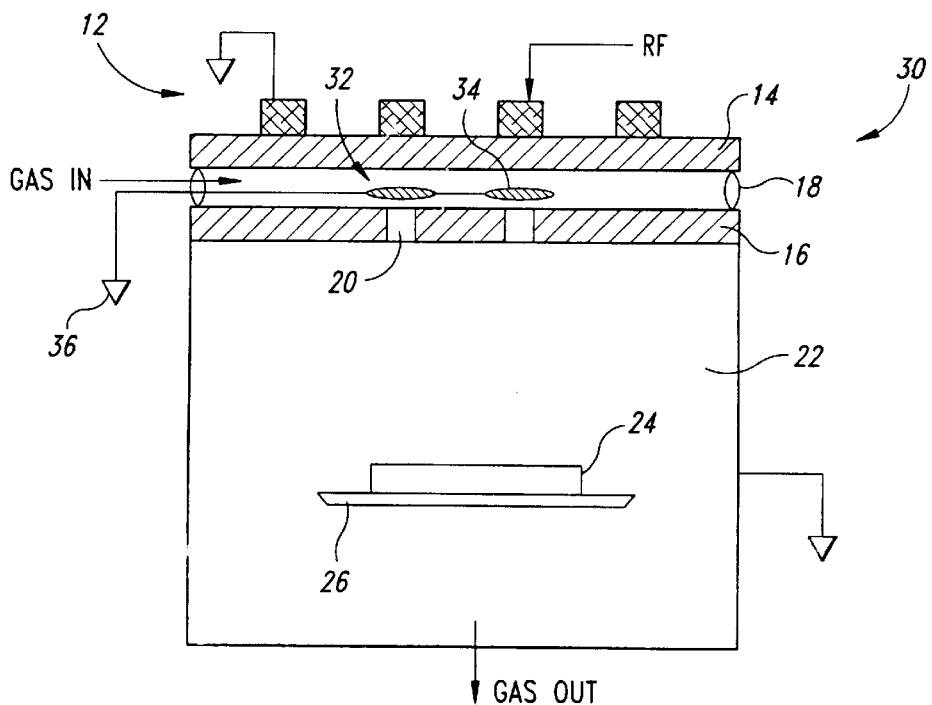
FIG. 2 is a partial cross-sectional view depicting a plasma etching device in accordance with an embodiment of the present invention.

FIG. 2 depicts a plasma etching device 30 in accordance with an embodiment of the present invention. The plasma etching device 30 largely includes components also included in the plasma etching device 10 described above in connection with the prior art. However, in contrast with the prior art approach, the plasma etching device 30 includes a shield structure 32 having a plurality of local shields 34 positioned in locations corresponding to the holes 20 of the gas distribution plate 16. The shield structure 32 is electrically connected to a source of controlled electric potential, such as a fixed potential like ground potential 36 or a variable potential like an RF potential, as desired. The local shields 34 provide a localized blocking of the capacitive coupling with the electrode 12, to a level sufficient to suppress electromagnetic field strengths that cause hole lightup effects.

The shield structure 32 does not, however, globally block the capacitive coupling of the electrode 12 with the gases contained in the reaction chamber 22. Such global capacitive coupling is desirable because it helps control the effects of ion bombardment on dielectric surfaces (such as the gas distribution plate 16). Further, electrostatic coupling of the electrode 12 with the gases contained in the reaction chamber 22 is, in fact, the mechanism by which ignition of the plasma occurs. Although inductive ignition of plasmas is possible, readily available equipment for plasma etching generates magnetic fields of strengths sufficient only to sustain ignited plasmas, and relies instead on capacitive coupling for actual ignition of those plasmas. Thus, a shield structure which does not deleteriously affect plasma ignition within the reaction chamber 22, while suppressing hole lightup plasma effects, provides a number of advantages over the prior art.

Figure 3:
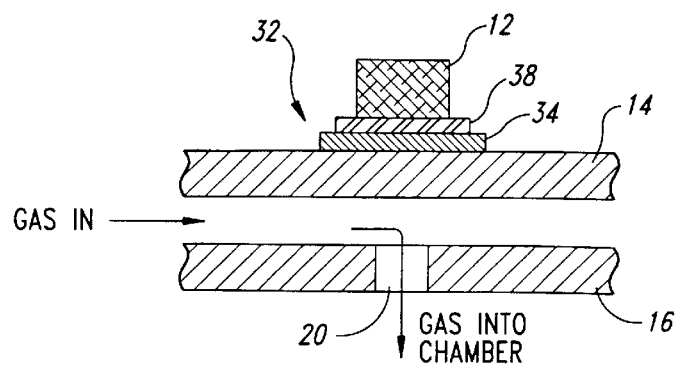
FIG. 3 is a partial cross-sectional view depicting a portion of a first embodiment of a shield structure included in the plasma etching device of FIG. 2.
Figure 4:
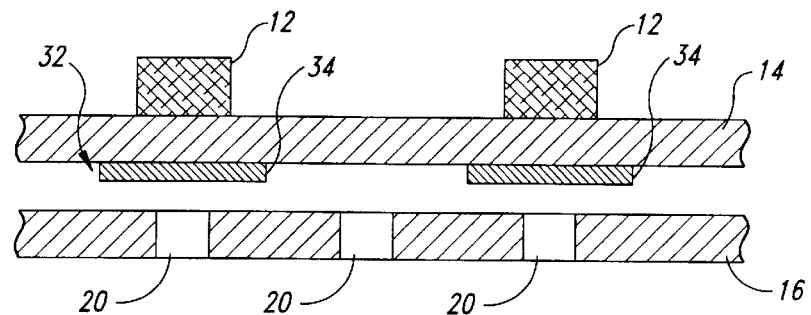
FIG. 4 is a partial cross-sectional view depicting a portion of a second embodiment of the shield structure included in the plasma etching device of FIG. 2.

FIG. 3 is a diagram which depicts a detail of one embodiment of the shield structure 32. In this embodiment, each of the local shields 34 is positioned between the electrode 12 and the window 14 at locations approximately above a corresponding one of the holes 20 in the gas distribution plate 16. A suitable electrical insulation structure or layer 38 separates the electrode 12 from direct physical contact with the shield structure 32. FIG. 4 shows a second embodiment, in which the local shields 34 are positioned on the opposite surface of the window 14 at locations below the electrode 12 and approximately above the corresponding hole 20. As shown in FIG. 4, certain of the holes 20 may not be positioned beneath a section of the electrode 12, in which case a local shield 34 need not be provided. However, providing and positioning local shields 34 at locations corresponding to each of the holes 20 can be readily accomplished and will provide increased protection against hole lightup effects, even in those holes in which such effects are expected to be minimal in the absence of shielding.

Figure 5:
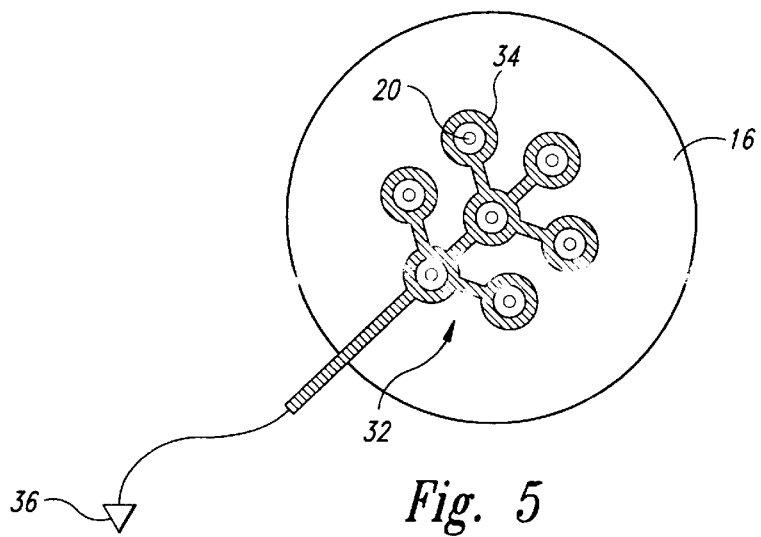
FIG. 5 is a top, plan view depicting a third embodiment of the shield structure included in the plasma etching device of FIG. 2.

FIG. 5 is a top view showing a third embodiment of the shield structure 32. In this case, each of the local shields 34 is annular in shape, which allows location of the shield structure immediately adjacent to the gas distribution plate 16. The annular openings provided in each of the local shields 34 allow source gases to flow into the openings 20 and into the reaction chamber 22 (see FIG. 2). As long as the annular opening in the local shield 34 is of a size that is small relative to the plasma sheath width, the requisite electrostatic shield effects will be provided. Again, as discussed above in connection with FIG. 4 (and as equally applicable to the embodiment depicted in FIG. 3), a local shield 34 need not be provided for each of the holes 20, but only for those holes positioned proximate to sections of the electrode 12. As depicted in FIG. 5, each of the local shields 34 is electrically connected to the others and to ground potential 36.

In plasma etching devices such as the Lam 9100, the holes 20 included in the gas distribution plate 16 are approximately 0.020 inches in diameter. Given the thicknesses of the dielectric window 14, the gas distribution plate 16, and the width of the gap therebetween, local shields 34 of approximately less than ½ inch in diameter should be sufficient to provide the desired shielding characteristics. However, those skilled in the art will appreciate a number of alternative geometrical configurations and sizes of local shield structures (in addition to those described above in connection with FIGS. 3–5) that can be employed with plasma etching devices like the Lam 9100 or adapted for use with other plasma etching devices.

Figure 6:
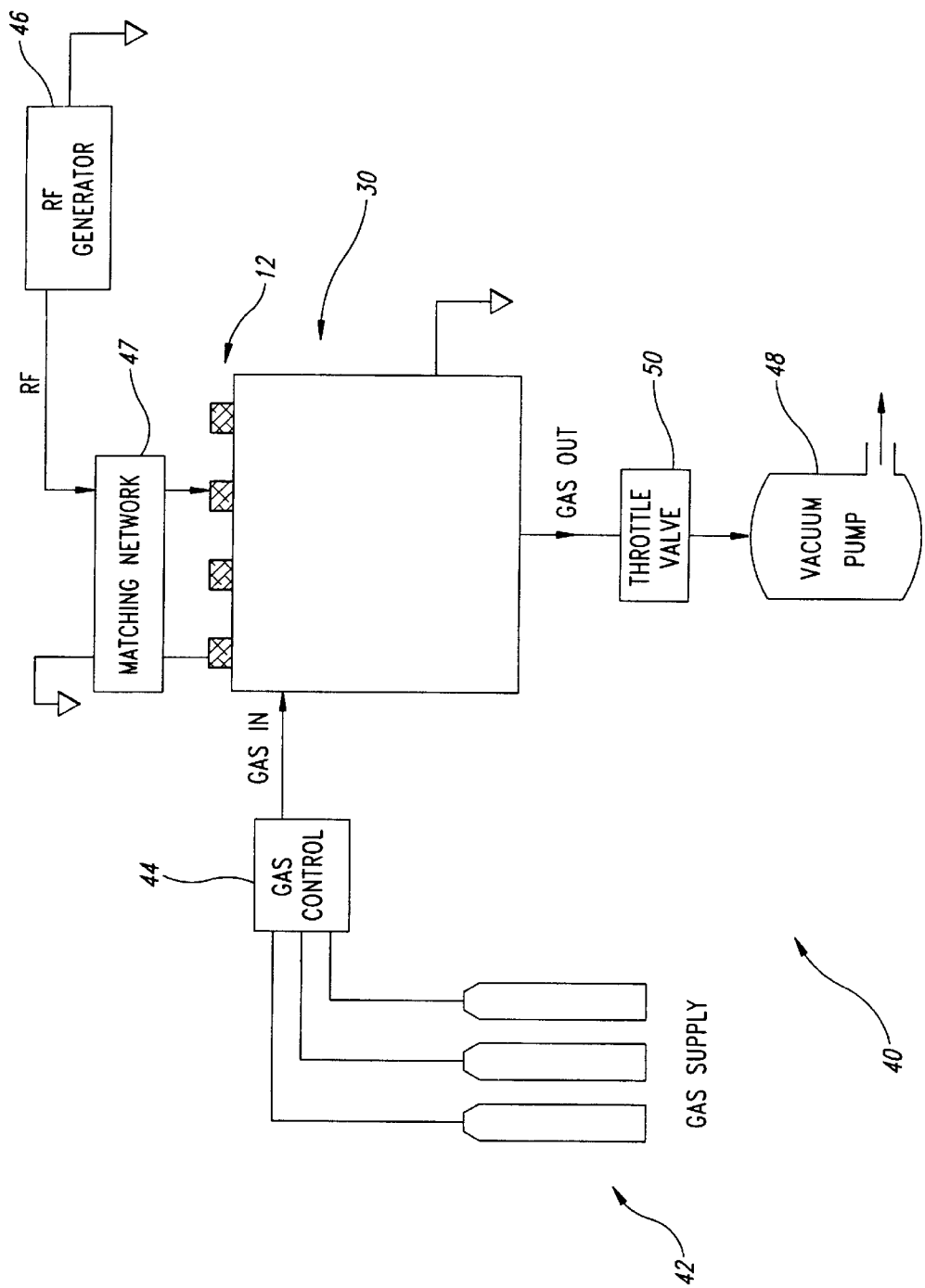
FIG. 6 is a block diagram depicting an etching system which includes the plasma etching device of FIG. 2.

FIG. 6 is a block diagram which depicts the major components of an etching system 40 in accordance with an embodiment of the present invention. The etching system 40 includes the plasma etching device 30 having the electrode 12. A plasma is generated from source gases, which are provided by a gas supply 42. The gas supply 42 is coupled to the plasma etching device 30 by a gas control panel 44, which selects and controls the flow of source gases into the plasma etching device. The high voltage signal applied to the electrode 12 is provided by a power generator, such as an RF generator 46, which is coupled with the electrode by an impedance matching network 47, as is well known in the art. Volatile reaction products, unreacted plasma species, and other gases are removed from the plasma etching device 30 by a gas removal mechanism, such as a vacuum pump 48 and throttle valve 50.

A number of advantages are provided in accordance with the various embodiments of the invention described above. The shield structure 32 suppresses local electric fields which cause the undesired hole lightup effects, but does not significantly block the capacitive coupling necessary to ignite the desired plasmas within the reaction chamber 22. By avoiding hole lightup, the disadvantages of changed gas distribution and etching process contamination are avoided. Furthermore, the alignment and dimension constraints of the current state of the art may be considerably relaxed. Thus, for example, the gas distribution plate 16 can be regularly rotated or otherwise moved to distribute wear. The useful life of the gas distribution plate is then significantly extended in comparison to prior art plasma etching devices. As a further example, the gas distribution holes 20 could be increased in size relative to prior art designs, which may provide improved process results, including more uniform etching of the semiconductor wafer 24 positioned within the reaction chamber 22. Those skilled in the art will also appreciate that the principle of local shielding in accordance with the present invention can be applied in other locations within plasma etching devices, such as at the edges of coil electrodes where undesired coupling to other parts of the reaction chamber might occur.

It will be appreciated that, although embodiments of the invention have been described above for purposes of illustration, various modifications may be made without deviating from the spirit and scope of the invention. For example, the particular configuration and position of the local shields 34 described above should not be construed to unduly limit the configuration and location of other similarly adapted shield structures which accomplish the purpose of local suppression of electric fields and their untoward effects. Those skilled in the art will also appreciate that the local shield structure and method taught in accordance with the present invention can be applied to devices and methods other than those associated with plasma etching of semiconductor material during integrated circuit fabrication. Also, those skilled in the art will appreciate that other localized shield structures and methods may be suitably adapted to function substantially as the particular electrostatic shield structures and methods described above. Indeed, numerous variations are well within the scope of the invention. Accordingly, the scope of the invention is not limited by the disclosure of particular embodiments, and terms used in the following claims should not be construed to limit the invention to these embodiments. Instead, the scope of the invention is determined entirely by the following claims.

What is claimed is:

1. A plasma etching device for etching selected materials during integrated circuit fabrication, comprising:
   a reaction chamber adapted to receive the selected materials;
   an electrode operable to produce an electromagnetic field for application to the gas within the reaction chamber to ignite a plasma therewithin;
   a gas flow structure adjoining the reaction chamber and positioned between the electrode and the reaction chamber including an opening through which gas flows into the reaction chamber; and
   a shield structure interposed between the electrode and the opening operable and positioned to suppress the electromagnetic field in a location adjacent to and within the opening to prevent plasma formation therewithin.

2. The plasma etching device of claim 1 wherein the gas flow structure includes first and second dielectric slabs with a gap therebetween, the first dielectric slab positioned adjacent to the electrode, and the second dielectric slab having the opening and positioned adjacent to the reaction chamber, the gas flowing through the gap into the opening and into the reaction chamber, and wherein the shield structure is interposed within the gap adjacent to the first dielectric slab and proximate to the opening in the second dielectric slab.

3. The plasma etching device of claim 1 wherein the gas flow structure includes first and second dielectric slabs with a gap therebetween, the first dielectric slab positioned adjacent to the electrode, and the second dielectric slab having the opening and positioned adjacent to the reaction chamber, the gas flowing through the gap into the opening and into the reaction chamber, and wherein the shield structure is positioned within the gap adjacent to the opening in the second dielectric slab.

4. The plasma etching device of claim 1 wherein the electrode is a coil electrode.

5. The plasma etching device of claim 1 wherein the electrode is a planar coil electrode.

6. The plasma etching device of claim 1 wherein the electrode is operable to produce an electric field to ignite the plasma.

7. The plasma etching device of claim 1 wherein the electrode is operable to produce an electric field to ignite the plasma, and wherein the shield structure includes an electrostatic shield to suppress the electric field in the location adjacent to and within the opening to prevent plasma formation therewithin.

8. The plasma etching device of claim 1 wherein the gas flow structure includes a plurality of openings, and wherein the shield structure includes a plurality of local shields, each of the openings having a corresponding one of the local shields positioned adjacent thereto.

9. The plasma etching device of claim 1 wherein the gas flow structure includes a plurality of openings, and wherein the shield structure includes a plurality of local shields, selected ones of the openings having a corresponding one of the local shields positioned adjacent thereto.

10. A plasma etching device for etching selected materials during integrated circuit fabrication, comprising:
    a chamber adapted to receive gas therewithin;
    an electromagnetic field source coupled with the chamber and operable to apply an electromagnetic field to the gas to ignite and sustain a plasma within the chamber;
    a gas distribution plate including a plurality of openings operable to pass the gas into the chamber positioned adjacent to the chamber and between the chamber and the electromagnetic field source, and;
    a shield structure including a plurality of local shields, and each adapted to be coupled to a corresponding source of controlled electric potential, wherein each of the local shields is positioned in a location adjacent to a corresponding one of the openings, the local shields substantially suppressing the electromagnetic field in locations adjacent to the local shields.

11. The plasma etching device of claim 10 wherein each of the local shields is of a substantially circular disk shape.

12. The plasma etching device of claim 11 wherein the electromagnetic field source includes an electrode positioned adjacent to the chamber, and wherein each of the local shields is positioned in a location adjacent to the electrode and adjacent to a corresponding one of the openings.

13. The plasma etching device of claim 12 wherein each of the local shields is of a substantially circular disk shape.

14. The plasma etching device of claim 10 wherein the electromagnetic field source includes an electrode positioned adjacent to the chamber, and wherein each of the local shields is positioned adjacent to a corresponding one of the openings.

15. The plasma etching device of claim 14 wherein each of the local shields is of substantially annular shape.

16. The plasma etching device of claim 10 wherein the plurality of local shields are electrically coupled to one another, and wherein the corresponding source of controlled electric potential is a source of approximately constant electric potential.

17. The plasma etching device of claim 10 wherein the plurality of local shields are electrically coupled to one another and to ground potential.

18. The plasma etching device of claimed 10 wherein the electromagnetic field source includes an electrode positioned adjacent to the chamber.

19. The plasma etching device of claim 10 wherein the electromagnetic field source includes a coil electrode positioned adjacent to the chamber.

20. The plasma etching device of claim 10 wherein the electromagnetic field source includes a planar coil electrode positioned adjacent to the chamber.

21. The plasma etching device of claim 10 wherein the chamber includes a single cavity in which the plasma is ignited and which is adapted to receive the selected materials for etching.

22. A method of forming a plasma from a gas contained within a chamber, comprising the steps of:

introducing a source gas into the chamber through a gas flow opening;

applying an electromagnetic field to the chamber of sufficient magnitude to ignite a plasma therewithin; and suppressing the magnitude of the applied electromagnetic field at a selected location adjacent to and within the gas flow opening to prevent ignition of a plasma at the selected location.

23. The method of claim 22 wherein the step of suppressing the magnitude of the electromagnetic field at a selected location adjacent to and within the gas flow opening includes the step of shielding the selected location.

24. The method of claim 22 wherein the step of applying an electromagnetic field to the chamber of sufficient magnitude to ignite a plasma therewithin includes the step of applying an electric field to ignite the plasma.

25. The method of claim 22 wherein the step of applying an electromagnetic field to the chamber of sufficient magnitude to ignite a plasma therewithin includes the step of applying an electric field to ignite the plasma, and wherein the step of suppressing the magnitude of the electromagnetic field at a selected location adjacent to and within the gas flow opening includes the step of electrostatically shielding the selected location.

26. The method of claim 22 wherein the step of applying an electromagnetic field to the chamber of sufficient magnitude to ignite a plasma therewithin includes the step of applying a time-varying electric field to ignite the plasma.

27. The method of claim 22 wherein the step of applying an electromagnetic field to the chamber of sufficient magnitude to ignite a plasma therewithin includes the step applying a time-varying magnetic field to the chamber to sustain the ignited plasma.

28. In a plasma etching device including a gas distribution device having an opening through which gas flows into a reaction chamber, the reaction chamber adapted to receive material to be etched by a plasma formed by application of an electromagnetic field to the gas, a method of preventing plasma formation at a region surrounding the opening and within the opening, comprising the step of suppressing the electromagnetic field in a location adjacent to the opening.

29. The method of claim 28 wherein the step of suppressing the electromagnetic field in a location includes the step of shielding the location.

30. The method of claim 28 wherein the step of suppressing the electromagnetic field in a location includes the step of electrostatically shielding the location.

31. In a plasma etching device including a gas distribution plate having a plurality of openings through which gas flows into a reaction chamber, the reaction chamber adapted to receive material to be etched by a plasma formed by application of an electric field to the gas, a method of preventing plasma formation at regions surrounding the openings and within the openings, comprising the step of suppressing the electric field in at least one location adjacent to a corresponding one of the openings.

32. The method of claim 31 wherein the step of suppressing the electric field in at least one location includes the step of shielding the location.

33. The method of claim 31 wherein the step of suppressing the electric field in at least one location includes the step of electrostatically shielding the location.

34. An etching system for etching selected materials, comprising:

a gas supply operable to provide source gas;

a power generator operable to provide a power sufficient to produce a plasma from the source gas; and a plasma etching device coupled with the gas supply and with the power generator, and including:

a reaction chamber adapted to receive the selected materials;

a gas flow structure adjoining the reaction chamber and operable to receive the source gas provided by the gas supply, the gas flow structure including an opening through which the source gas flows into the reaction chamber;

an electrode operable to receive the power produced by the power generator and correspondingly producing an electromagnetic field for application to the source gas within the reaction chamber to ignite a plasma; and a shield structure operable and positioned to suppress the electromagnetic field in locations adjacent to and within the opening to prevent plasma formation in these locations.

35. The etching system of claim 34 further comprising a gas removal mechanism coupled with the plasma etching device and operable to remove gas therefrom.

36. The etching system of claim 35 wherein the gas removal mechanism includes a vacuum pump.

37. The etching system of claim 34 further comprising a gas control panel coupling the gas supply with the plasma etching device and operable to control the flow of source gas into the plasma etching device.

38. The etching system of claim 36 wherein the power generator is an RF generator.

* * * * *

UNITED STATES PATENT AND TRADEMARK OFFICE
CERTIFICATE OF CORRECTION

PATENT NO. : 6,719,873 B1　　　　　　　　　　　　　　　　　　　　Page 1 of 1
DATED : April 13, 2004
INVENTOR(S) : Kevin G. Donohoe It is certified that error appears in the above-identified patent and that said Letters Patent is hereby corrected as shown below:

Column 1,
Line 7, "is a Continuation of" should read -- is a continuation of --
Line 39, "by Lain Research, Inc." should read -- by Lam Research, Inc. --

Column 6,
Line 30, "field source, and;" should read -- field source; and --

Column 8,
Line 51, "etching system of claim 36" should read -- etching system of claim 34 --

Signed and Sealed this

Fourth Day of January, 2005

JON W. DUDAS
*Director of the United States Patent and Trademark Office*